United States Patent [19]

Rabenstein

[11] Patent Number: 4,912,667
[45] Date of Patent: Mar. 27, 1990

[54] TRANSMISSION ARRANGEMENT FOR DIGITAL SIGNALS

[75] Inventor: Rudolf Rabenstein, Erlangen, Fed. Rep. of Germany

[73] Assignee: ANT Nachrichtentechnik GmbH, Backnang, Fed. Rep. of Germany

[21] Appl. No.: 146,190

[22] Filed: Jan. 20, 1988

[30] Foreign Application Priority Data

Jan. 26, 1987 [DE] Fed. Rep. of Germany ....... 3702215

[51] Int. Cl.$^4$ .............................................. G06F 15/31
[52] U.S. Cl. ................................................. 364/724.13
[58] Field of Search ...................... 364/724.01, 724.13, 364/724.10

[56] References Cited

U.S. PATENT DOCUMENTS

| | | | |
|---|---|---|---|
| 3,808,412 | 4/1974 | Smith | 364/724.13 |
| 4,285,045 | 8/1981 | Tamori et al. | 364/724.01 |
| 4,621,366 | 11/1986 | Cain et al. | 375/8 |
| 4,725,972 | 2/1988 | Göckler | 364/724.10 |

FOREIGN PATENT DOCUMENTS

| | | |
|---|---|---|
| 0135066 | 3/1985 | European Pat. Off. |
| 2840471 | 3/1980 | Fed. Rep. of Germany |
| 3333274 | 4/1985 | Fed. Rep. of Germany |
| 3333275 | 4/1985 | Fed. Rep. of Germany |

OTHER PUBLICATIONS

Schonfeld, T. J., et al., "A Rapidly Converging First-Order Training Algorithm for an Adaptive Equalizer," *IEEE Transactions on Information Theory*, 1971, pp. 431–439.
Schüssler, H. W., "Implementation of Variable Digital Filters," *Signal Processing Theories and Applications*, 1980, pp. 123–129.
Schröder, H., "High Word-Rate Digital Filters with Programmable Table Look-up," *IEEE Transactions on Circuits and Systems*, 1976, pp. 277–279.
Japanese patent abstract 59-207720.

*Primary Examiner*—David L. Clark
*Assistant Examiner*—Long T. Nguyen
*Attorney, Agent, or Firm*—Spencer & Frank

[57] ABSTRACT

Digital transmission arrangement operating with coded scanning samples and whose transfer function can be changed without interrupting operation and with low interference starting from an initial transfer function to a final transfer function, the arrangement including a switching device for the transmission coefficients to be associated with each transmission member of the transmission arrangement for switching from a set of starting coefficients to a set of final coefficients, the switching device being configured to switch in a single set of intermediate coefficients ($c_0$) between the set of starting coefficients ($c-$) and the set of final coefficients ($c+$), and the set of intermediate coefficients ($c_0$) being determined, as a function of the set of starting coefficients ($c-$) and the set of final coefficients ($c+$), so that the interference to be expected during switching is minimized.

16 Claims, 7 Drawing Sheets

FIG.6
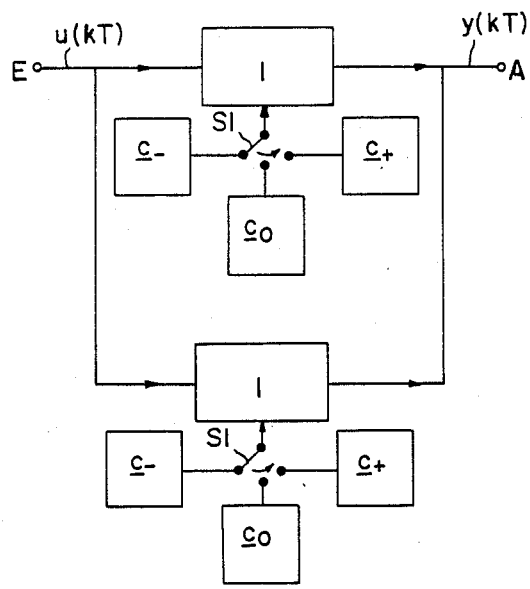
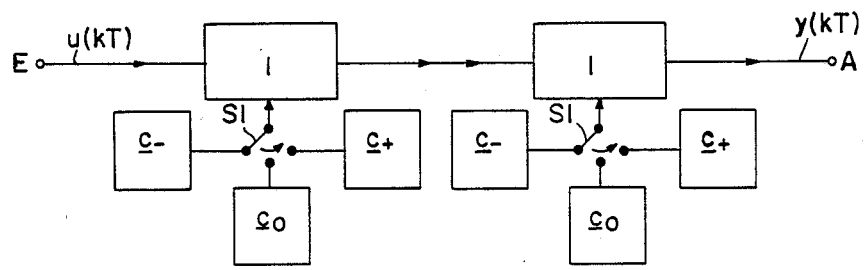
FIG.7

TRANSMISSION ARRANGEMENT FOR DIGITAL SIGNALS

BACKGROUND OF THE INVENTION

The present invention relates to a transmission arrangement for digital signals operating with coded scanning samples and whose transfer function can be changed without interrupting operation and with low interference starting from an initial transfer function to a final transfer function, the arrangement including switching means for the transmission coefficients to be associated with each transmission member of the transmission arrangement for switching from a set of starting coefficients to a set of final coefficients. Such a transmission arrangement can generally be used for digital filtering, as well as for level control, with filter parameters, i.e. a set of coefficients for a transmission member, which are switched during operation. Voice, music and also inaudible signals can be used as digital signals.

The simplest method to change the transfer function of a transmission arrangement for digital signals during operation is to exchange the entire set of coefficients between two sampling times. However, such an abrupt, instantaneous switching of the set of coefficients, if no special measures are taken for interference suppression, results in interference in the output signal of the transmission arrangement, particularly—for example in connection with audio signals—interference which is annoying to the ear. For example, clicking noises result which, depending on the configuration and arbitrary selection of the moment of switching, have a more or less annoying effect.

It is conceivable to reduce such interference by including interference suppression members in the path of the digital signals. However, such solutions have not been found to be fully satisfactory because they influence the useful signal in an undesirable manner.

However, in Federal Republic of Germany Patent Application P 3,333,274.6, published April 18th, 1985, it was proposed to provide a second branch including a second digital transmission member in parallel with the transmission member whose set of coefficients is to be switchable. If a change in the transfer function of the first transmission member is desirable, instead of changing the coefficients of the first transmission member, the coefficients of the second transmission member are switched to the desired values. The output value of the second transmission member, however, is transferred by switching means to the output of the transmission arrangement only if a discriminator, which is connected to be effective with a delay equivalent to the transient period of the second transmission member, causes the switching of the switching means after completing a comparison of the output values of the two transmission members.

However, this transmission arrangement has a number of drawbacks, the most serious one being the fact that the expenditures for hardware or computations must be doubled to permit switching of coefficients.

In a further Federal Republic of Germany Application, P 3,333,275.4, published April 18th, 1985, it was proposed to associate the transmission members, by way of switching members, with intermediate coefficients (formed by interpolation values between a set of starting coefficients and a set of final coefficients) which are to assure that the transfer function of the transmission member changes in small increments from a starting transfer function to a final transfer function.

This transmission arrangement also still has some drawbacks.

1. To realize a noticeable improvement compared to the abrupt switching, a relatively large number of intermediate steps are necessary in some cases.

2. During these intermediate steps, the transmission coefficients are linearly interpolated independently of one another between their respective starting and final values. Under certain circumstances, the transfer functions associated with these intermediate coefficients may deviate considerably more from the initial or final transfer functions than from one another. This may cause the development of considerable interference signals during the switching process.

3. Special interpolation means are necessary to generate the intermediate coefficients.

SUMMARY OF THE INVENTION

It is an object of the present invention to provide a transmission arrangement of the above-mentioned type which permits switching with as little interference as possible and with the lowest possible expenditures for computation and circuitry.

The above and other objects are accomplished, according to the present invention, by a digital transmission arrangement operating with coded scanning samples and having a transfer function which can be changed without interrupting operation and with low interference, starting from an initial transfer function and ending with a final transfer function, with each transfer function being defined by respective coefficients, the arrangement comprising: at least one transmission member having a transfer function which is determined by transmission coefficients supplied to said member; and switching means connected to the transmission member and switchable for selectively supplying to the transmission member a first set of coefficients constituting a set of starting coefficients and a second set of coefficients constituting a set of final coefficients, wherein the switching means comprise: means for supplying to the transmission member, during a selected time, a single set of intermediate coefficients ($c_0$) between the set of starting coefficients ($c_-$) and the set of final coefficients ($c_+$); and coefficient value determining means giving the set of intermediate coefficients ($c_0$) values which are a function of at least one of the set of starting coefficients ($c_-$) and the set of final coefficients ($c_+$) so that the interference to be expected during switching from the set of starting coefficients to the set of final coefficients is minimized.

The arrangement according to the invention has the advantage of switching with low interference, while requiring relatively low manufacturing costs. Moreover, switching becomes very fast, in the extreme case within two sampling periods.

The invention will now be described with reference to the drawing figures.

BRIEF DESCRIPTION OF THE DRAWING

FIGS. 6 and 7 are block circuit diagrams illustrating two exemplary embodiments of an arrangement according to the present invention.

DESCRIPTION OF THE PREFERRED EMBODIMENTS

Figure 1:
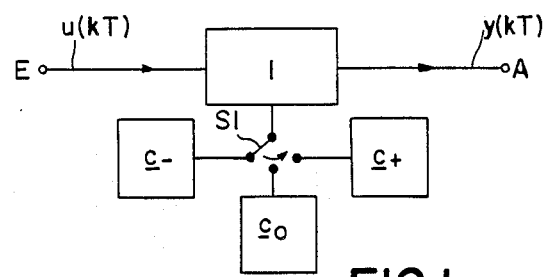
FIG. 1 is a schematic block diagram showing the basic structure of a transmission arrangement according to the present invention.

The transmission arrangement shown in FIG. 1 includes an input E which receives a digital input signal $u(kT)$ from which a transmission member 1 generates a digital output signal $y(kT)$ which is supplied to output A. Transmission member 1 may be associated, via switching means S1, with three successive different sets of coefficients beginning with a set of starting coefficients $c_-$ through a set of intermediate coefficients $c_0$ to a set of final coefficients $c_+$. While the set of starting coefficients and the set of final coefficients are given by the specific application, the set of intermediate coefficients is selected as prescribed below so that interference during switching remains as low as possible. Various mathematical descriptions of the interference signals will be explained with reference to FIG. 2.

Figure 2:
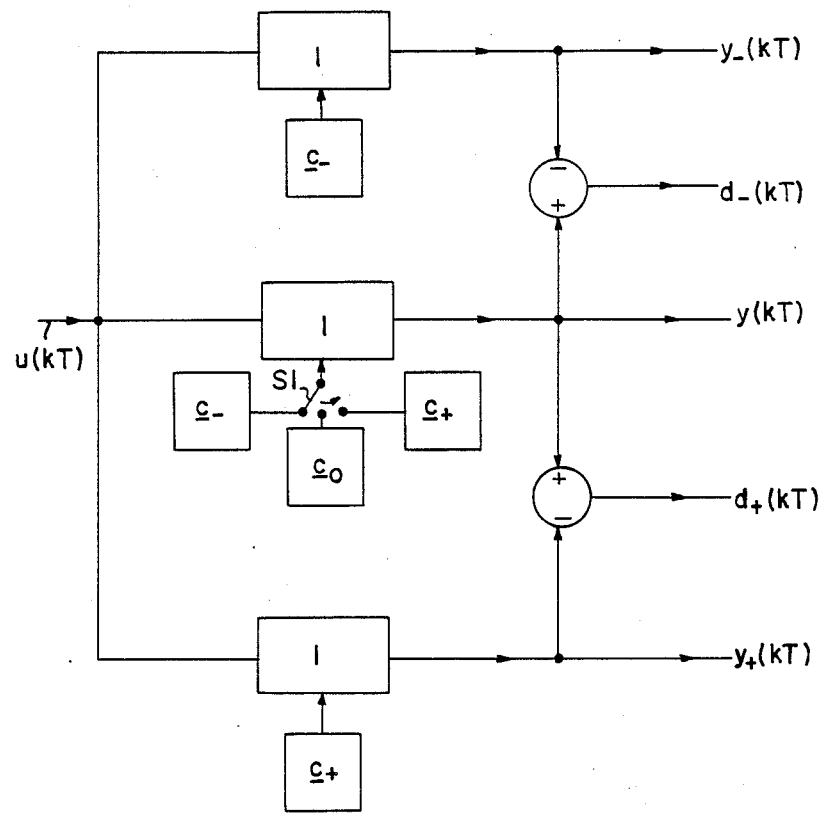
FIG. 2 is a block circuit diagram showing three transmission arrangements which are associated with three different sets of coefficients and whose output signals serve for the formation of difference signals that are to be minimized in a prescribed manner. The invention is implemented as shown in FIG. 1, while FIG. 2 serves merely to describe the terminology employed.

FIG. 2 shows an arrangement of three parallel connected transmission members 1 which also jointly receive the input signal $u(kT)$. The upper transmission member 1 and the lower transmission member 1 are operated with constant coefficients (i.e. without switching), with the set of starting coefficients $c_-$ being associated with the upper transmission member and the set of final coefficients $c_+$ being associated with the lower transmission member. The middle transmission member is associated with three sets of coefficients $c_-$, $c_0$ and $c_+$ which are switched as shown in FIG. 1.

The upper transmission member provides the output signal $y_-(kT)$, i.e. the output signal of the transmission arrangement before the moment of switching. The lower transmission member generates an output signal $y_+(kT)$, which corresponds to the output signal of the transmission arrangement after the moment of switching. The middle transmission member generates an output signal $y(kT)$ which corresponds to the output signal of the transmission arrangement if, according to FIG. 1, it is associated with the sets of starting, intermediate and final coefficients in a switchable manner. By means of two substracting members, the differences $d_-(k)=y(k)-y_-(k)$ and $d_+(k)=y(k)-y_+(k)$ are now formed and are used as difference signals as prescribed below for the computation of the minimization.

EXAMPLE

Figure 3:
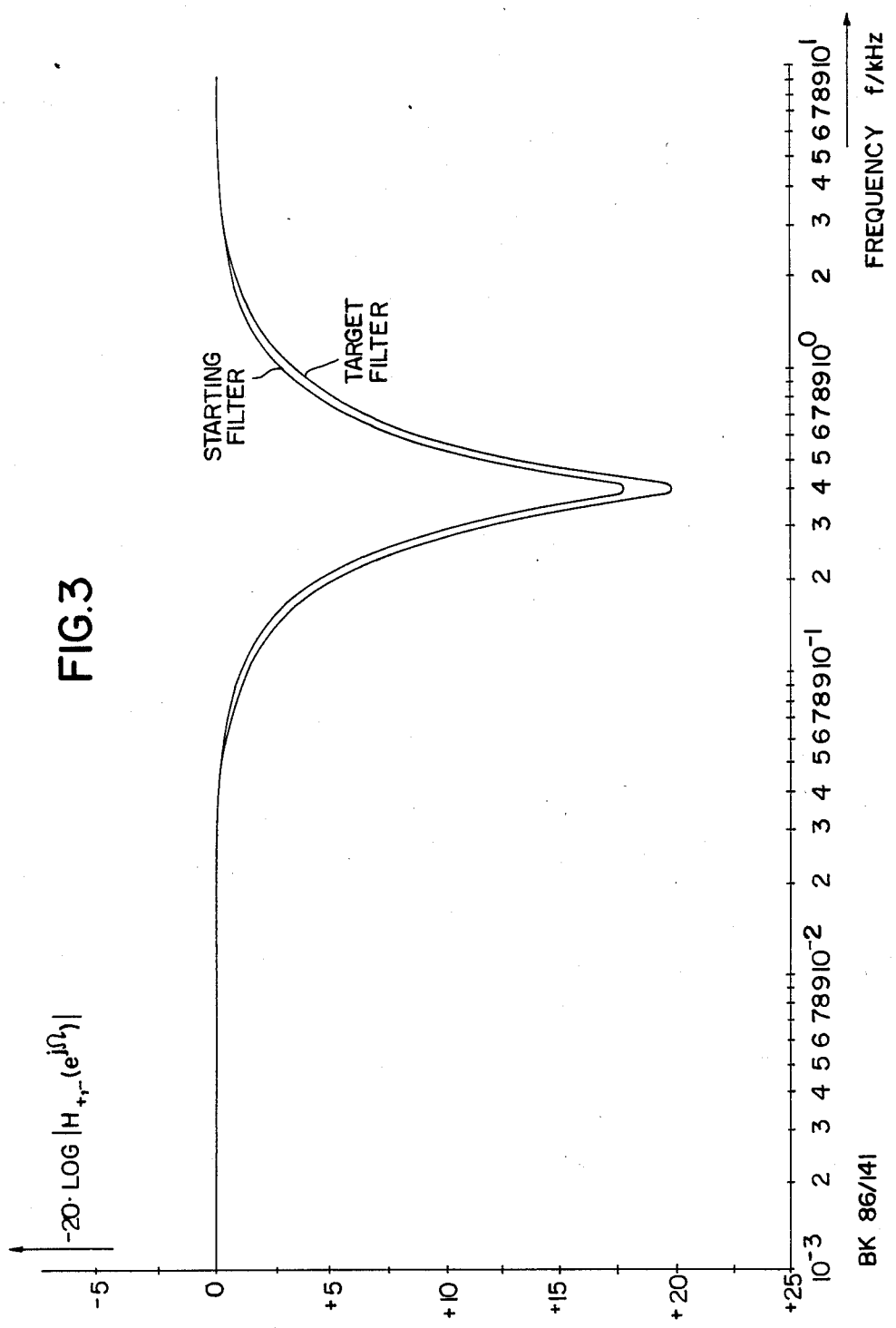
FIG. 3 is a diagram showing frequency response curves used to determine filter coefficient values in accordance with the invention.

The reduction of interference signals by switching via sets of intermediate coefficients will now be shown in an example. The sets of starting and final coefficients are shown in Table 1, below. The associated frequency curves $H_+(e^{j\Omega})$ and $H_-(e^{j\Omega})$ are shown in FIG. 3. A sequence of sampled values $u(kT)=\sin(\pi/63 - k)$ serves as input signal. This frequency lies in the minimum of the two frequency curves.

TABLE 1

| Set of Starting Coefficients | Set of Final Coefficients |
|---|---|
| $A_- = \begin{pmatrix} 0.9514806 & 3.7822104 \cdot 10^{-3} \\ -3.7822104 \cdot 10^{-3} & 0.9514806 \end{pmatrix}$ | $A_+ = \begin{pmatrix} 0.9696681 & 0 \\ 0 & 0.9223652 \end{pmatrix}$ |
| $B_- = \begin{pmatrix} 4.50276028 \cdot 10^{-2} \\ 4.85798208 \cdot 10^{-2} \end{pmatrix}$ | $B_+ = \begin{pmatrix} 3.0331910 \cdot 10^{-2} \\ -7.7634811 \cdot 10^{-2} \end{pmatrix}$ |
| $C_- = \begin{pmatrix} 10.66239 \\ -11.50351 \end{pmatrix}$ | $C_+ = \begin{pmatrix} 1.978881 \\ 1.931385 \end{pmatrix}$ |
| $D_- = 0.9536236$ | $D_+ = 0.9524227$ |

Figure 4A:
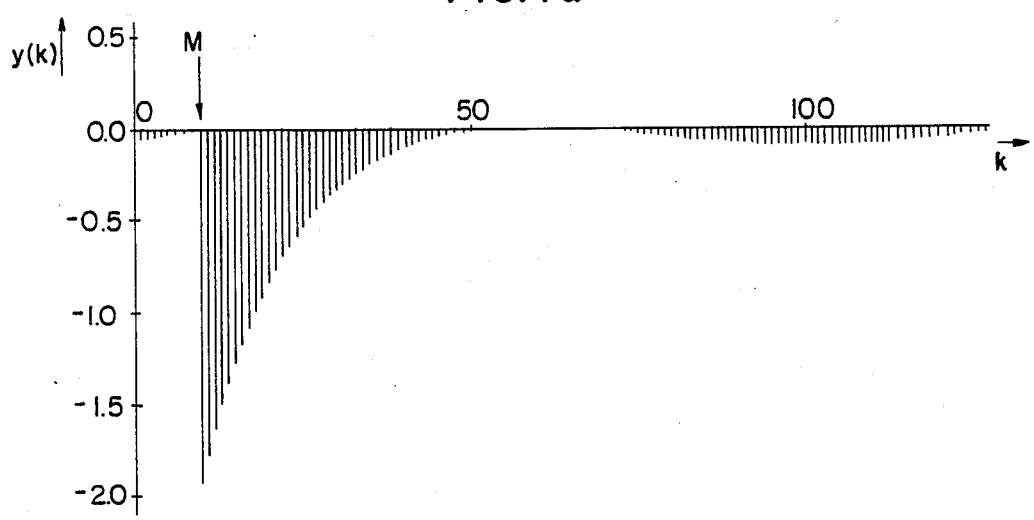
FIGS. 4a, 4b, 4c, 4d, 4e, 4f and 4g are signal waveform diagrams illustrating switching operations employing intermediate coefficients derived by interpolation techniques.
Figure 4B:
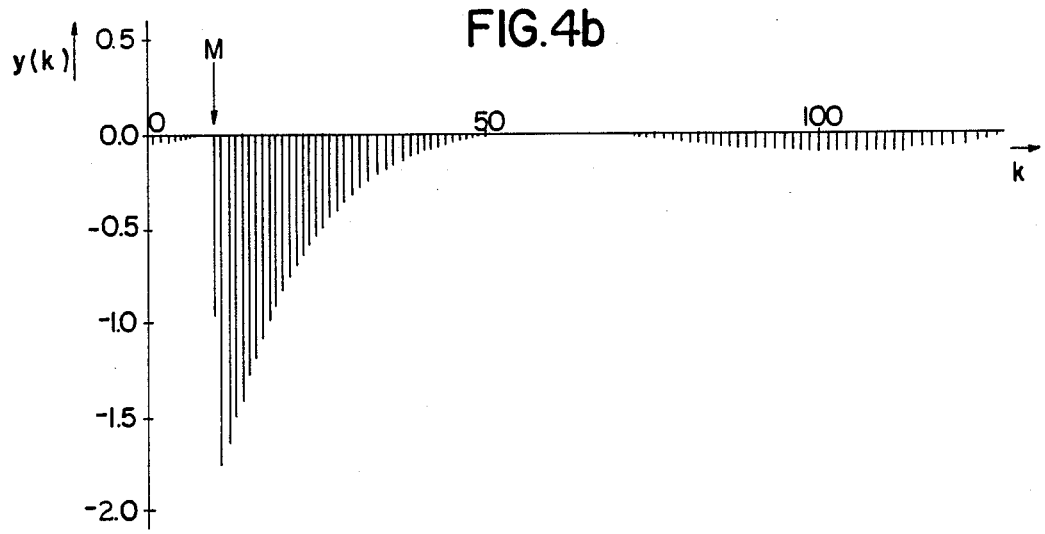
Figure 4C:
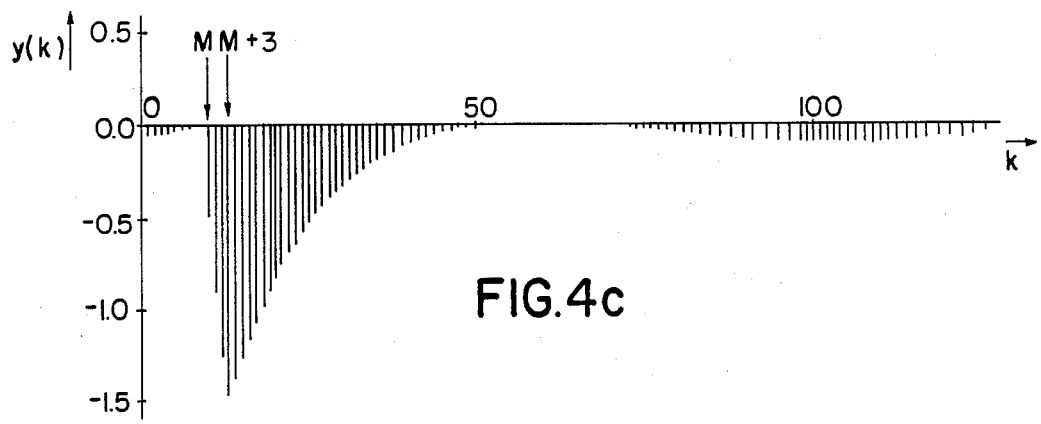
Figure 4D:
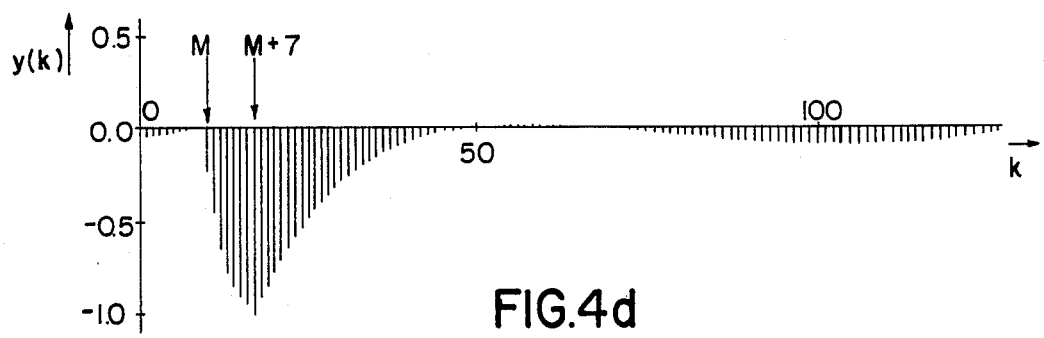
Figure 4E:
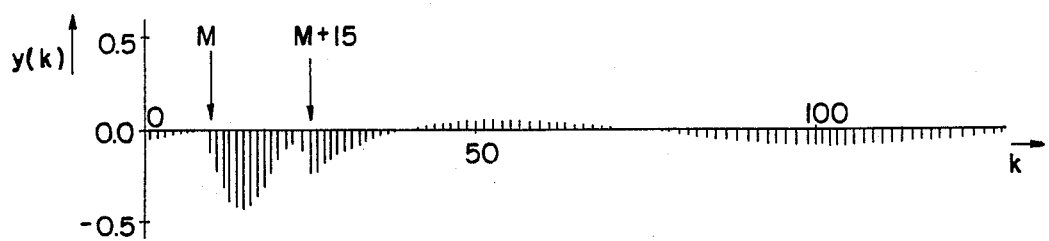
Figure 4F:
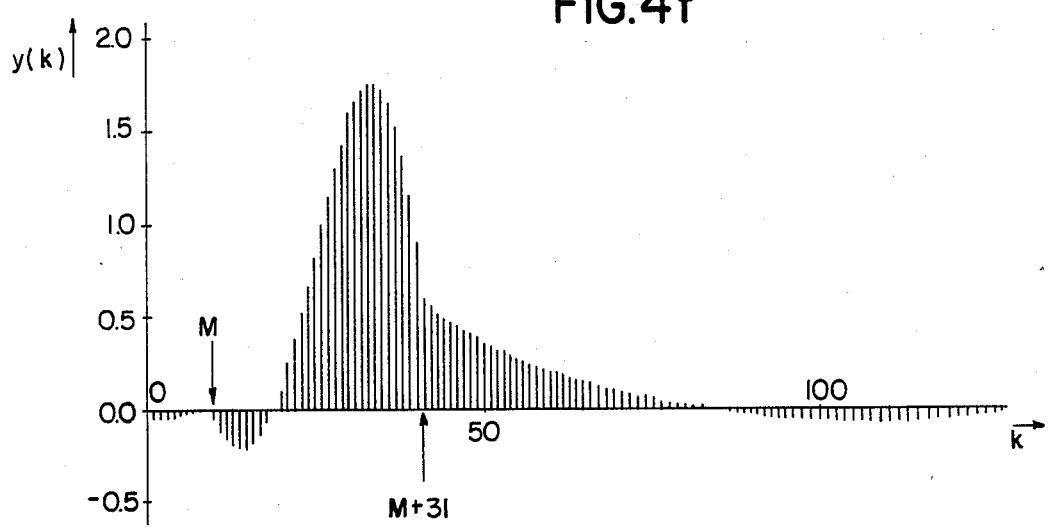
Figure 4G:
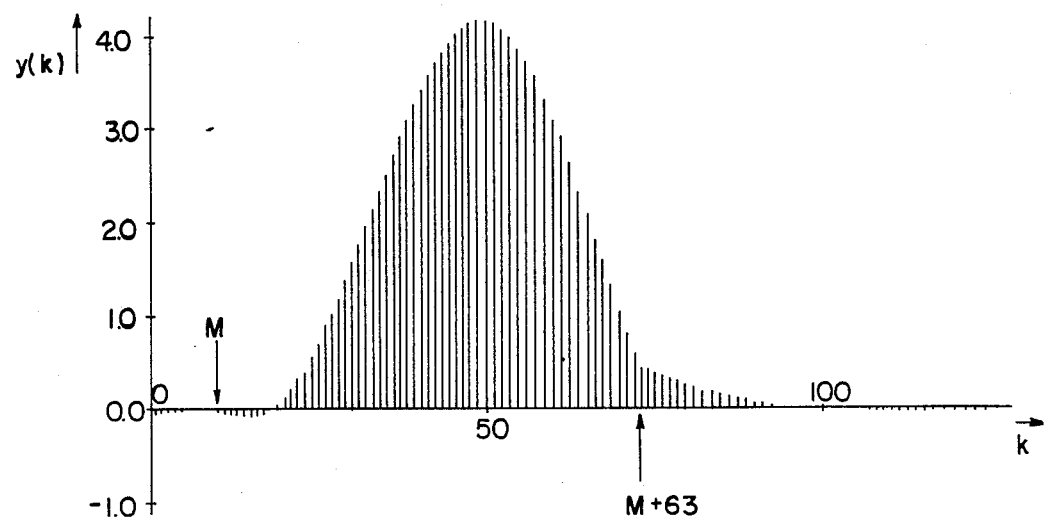

FIG. 4a shows the output signal of a transmission arrangement in which a switch is made directly from the set of starting coefficients to the set of final coefficients, i.e. without inclusion of a set of intermediate coefficients. The letter M indicates the moment of switching. A steep rise of the output signal is clearly noticeable. The output signal of a transmission arrangement according to the above mentioned West German patent application (FRG P 3,333,275.4) is shown in FIGS. 4b, 4c, 4d, 4e, 4f and 4g. Here a switch is made from the set of starting coefficients to the set of final coefficients by way of a number of sets of intermediate coefficients which were obtained by interpolation. Although the rise of the output signal can be reduced compared to direct switching, there still remains a noticeable interference component.

Figure 5A:
FIGS. 5a 5b and 5c are diagrams similar to those of FIGS. 4 illustrating switching operations employing intermediate coefficients derived according to the present invention.
Figure 5B:
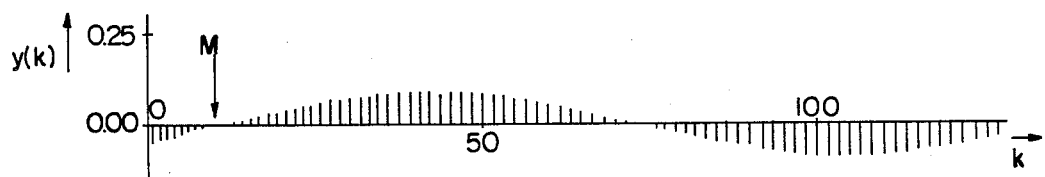
Figure 5C:
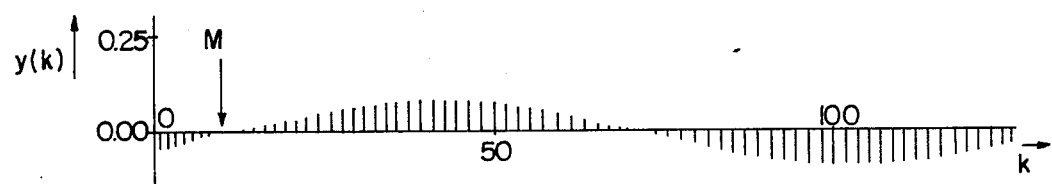

Finally, FIGS. 5a, 5b and 5c show the output signals of a transmission arrangement according to three preferred embodiments of the invention, in the context of the circuit arrangement shown in FIG. 1. It can be seen that the interference components were eliminated almost completely.

These three embodiments are based on three solutions to the problem addressed by the present invention.

According to solution 1, the result of which is shown in FIG. 5a, the set of intermediate coefficients ($c_0$) is given values such that, upon input to the transmission member of an arbitrary signal of any desired power density, the expected value $E(d_-^2(K))$ of the square of the difference signal $d_-(k)=y(kT)-y_-(kT)$ between the output signal $y(kT)$ of the transmission member when operated with the set of intermediate coefficients $(c_0)$ and the output signal $y_-(kT)$ of the transmission member when operated with the set of starting coefficients $(c_-)$ becomes a minimum for $k=0, 1, 2$, where k is the sample number, when the switching means apply the set of starting coefficients $(c_-)$ for $k<0$, the set of intermediate coefficients $(c_0)$ for $k=0$ and the set of final coefficients $(c_+)$ for $k>0$.

According to solution 2, the result of which is shown in FIG. 5b, the set of intermediate coefficients $(c_0)$ is given values such that, upon input to the transmission member of an arbitrary signal of any desired power density, the sum $$\sum_{k=0}^{\infty} E(d_-^2(k))$$

of the expected values $E(d_-^2(K))$ of the squares of the difference signal $d_-(k)=y(kT)-y_-(kT)$ between the output signal $y(kT)$ of the transmission member when operated with the set of intermediate coefficients $(c_0)$ and the output signal $y_-(kT)$ of the transmission member when operated with the set of starting coefficients $(c_-)$ becomes a minimum for all $k \geq 0$, where k is the sample number, when the switching means apply the set of starting coefficients $(c_-)$ for $k<0$, the set of intermediate coefficients $(c_0)$ for $k=0$ and the set of final coefficients $(c_+)$ for $k>0$.

According to solution 3, the result of which is shown in FIG. 5c, the set of intermediate coefficients $(c_0)$ is given values such that, upon input to the transmission member of an arbitrary signal of any desired power density, the sum $$\sum_{k=0}^{\infty} E(d_+^2(k))$$

of the expected values $E(d_-^2(K))$ of the squares of the difference signal $d_+(k)=y(kT)-y_+(kT)$ between the output signal $y(kT)$ of the transmission member when operated with the set of intermediate coefficients $(c_0)$ and the output signal $y_+(kT)$ of the transmission member when operated with the set of final coefficients $(c_+)$ becomes a minimum for all $k \geq 0$, where k is the sample number, when the switching means apply the set of starting coefficients $(c_-)$ for $k<0$, the set of intermediate coefficients $(c_0)$ for $k=0$ and the set of final coefficients $(c_+)$ for $k>0$.

Calculation of the Intermediate Coefficients

The coefficients of a digital filter in state space structure are described by state matrixes A, B, C, D.

The concept of designing digital filter structures according to the state space description is outlined e.g. in reference [1], [2]. For simplification of the expression, these can be combined in a block matrix S. The sets of coefficients $c^*$ are then composed of the elements of the matrixes $S^*$ $$S^* = \begin{bmatrix} A^* & B^* \\ C^* & D^* \end{bmatrix}$$

where * stands for $-$, 0, or $+$. The sets of starting and final coefficients are described by the matrixes $S_-$ and $S_+$. In this manner of writing, the minimization of the difference signals according to the three preferred solutions leads (after a longer computation) to intermediate coefficients described by the matrix $S_0$ which is computed from the set of starting coefficients and the set of final coefficients according to the following equations:

$$S_0 = \begin{bmatrix} T_{3,4} & 0 \\ 0 & 1 \end{bmatrix} S_- \quad \text{(solutions 1,2)}$$

and $$S_0 = S_+ \begin{bmatrix} T_5 & 0 \\ 0 & 1 \end{bmatrix} \quad \text{(solution 3)}$$

The following applies for matrixes T $$T_3 = \begin{bmatrix} C_+' \\ C_+'A_+ \end{bmatrix}^{-1} \begin{bmatrix} C_-' \\ C_-'A_- \end{bmatrix}$$

$$T_4 = W_{++}^{-1} W_{+-}$$

$$T_5 = K_{+-} K_{--}^{-1}$$

$K_{12}$ and $W_{12}$ are the (cross) covariance matrixes which are generally defined as follows:

$$K_{12} = \sum_{k=0}^{\infty} (A_1^k B_1)(A_2^k B_2)'$$

$$W_{12} = \sum_{k=0}^{\infty} (C_1 A_1^k)'(C_2 A_2^k)$$

The numerals 1 and 2 stand for $+$ or $-$. $A'$ is the matrix transposed to A.

Different methods of calculating the cross-covariance matrixes will be given below.

Calculation of the Cross-Covariance Matrixes

1. General space state structure for a second grade block; i.e. a second degree digital filter in state space structure:

In general terms, the sets of starting and final coefficients read as follows:

$$A_- = \begin{bmatrix} a_{11}^- & a_{12}^- \\ a_{21}^- & a_{22}^- \end{bmatrix} B_- = \begin{bmatrix} b_1^- \\ b_2^- \end{bmatrix} C_- = [c_1^- \ c_2^-] \ D_- = d^-$$

$$A_+ = \begin{bmatrix} a_{11}^+ & a_{12}^+ \\ a_{21}^+ & a_{22}^+ \end{bmatrix} B_+ = \begin{bmatrix} b_1^+ \\ b_2^+ \end{bmatrix} C_+ = [c_1^+ \ c_2^+] \ D_+ = d^+$$

The elements of the matrix $K_{+-}$ $$K_{+-} = \begin{bmatrix} k_{11} & k_{12} \\ k_{21} & k_{22} \end{bmatrix}$$

are then obtained from the solution of the following equation system:

$$\begin{bmatrix} 1 - a_{11}^+ \overline{a_{11}} & -a_{11}^+ \overline{a_{12}} & -a_{12}^+ \overline{a_{11}} & -a_{12}^+ \overline{a_{12}} \\ -a_{11}^+ \overline{a_{21}} & 1 - a_{11}^+ \overline{a_{22}} & -a_{12}^+ \overline{a_{21}} & -a_{12}^+ \overline{a_{22}} \\ -a_{21}^+ \overline{a_{11}} & -a_{21}^+ \overline{a_{12}} & 1 - a_{22}^+ \overline{a_{11}} & -a_{22}^+ \overline{a_{12}} \\ -a_{21}^+ \overline{a_{21}} & -a_{21}^+ \overline{a_{22}} & -a_{22}^+ \overline{a_{21}} & 1 - a_{22}^+ \overline{a_{22}} \end{bmatrix} \cdot \begin{bmatrix} k_{11} \\ k_{12} \\ k_{21} \\ k_{22} \end{bmatrix} = \begin{bmatrix} b_1^+ b_1^- \\ b_2^+ b_1^- \\ b_1^+ b_2^- \\ b_2^+ b_2^- \end{bmatrix}$$

Matrix $K_{--}$ is obtained by replacing + with −. Matrixes $W_{+-}$ and $W_{++}$ are obtained in the same manner if $a_{12}$ and $a_{21}$ are exchanged and $b_1$ is replaced by $c_1$ and $b_2$ is replaced by $c_2$.

2. State space structure for a second grade block in normal form:

For this special case of the general state space structure, a direct calculation is possible.

2.1 Real poles

In general terms, the sets of starting and final coefficients read as follows:

$$A_- = \begin{bmatrix} a_1^- & 0 \\ 0 & a_2^- \end{bmatrix} B_- = \begin{bmatrix} b_1^- \\ b_2^- \end{bmatrix} C_- = [c_1^- \ c_2^-] \ D_- = d^-$$

$$A_+ = \begin{bmatrix} a_1^+ & 0 \\ 0 & a_2^+ \end{bmatrix} B_- = \begin{bmatrix} b_1^+ \\ b_2^+ \end{bmatrix} C_+ = [c_1^- \ c_2^-] \ D_+ = d^-$$

The elements of matrix $K_{+-}$ are the following:

$$k_{ij} = \frac{b_i^+ b_j^-}{1 - a_i^+ a_j^-} \quad i,j = 1,2$$

2.2 Conjugated complex poles.

In general terms, the sets of starting and final coefficients read as follows:

$$A_- = \begin{bmatrix} a_1^- & a_2^- \\ -a_2^- & a_1^- \end{bmatrix} B_- = \begin{bmatrix} b_1^- \\ b_2^- \end{bmatrix} C_- = [c_1^- \ c_2^-] \ D_- = d^-$$

$$A_+ = \begin{bmatrix} a_1^+ & a_2^+ \\ -a_2^+ & a_1^+ \end{bmatrix} b_+ = \begin{bmatrix} b_1^+ \\ b_2^+ \end{bmatrix} C_+ = [c_1^+ \ c_2^+] \ D_+ = d^+$$

The elements of matrix $K_{+-}$ can be obtained by the following steps:

$$P_R = \tfrac{1}{2}(b_1^+ b_1^- + b_2^+ b_2^-) \quad P_I = \tfrac{1}{2}(b_1^+ b_2^- - b_2^+ b_1^-)$$

$$Q_R = 1 - (a_1^+ a_1^- + a_2^+ a_2^-) \quad Q_I = -(a_2^+ a_1^- - a_4^+ a_2^-)$$

$$S_R = \tfrac{1}{2}(b_1^+ b_1^- - b_2^+ b_2^-) \quad S_I = -\tfrac{1}{2}(b_1^+ b_2^- + b_2^+ b_1^-)$$

$$T_R = 1 - (a_1^+ a_1^- - a_2^+ a_2^-) \quad T_I = -(a_1^+ a_2^- + a_2^+ a_1^-)$$

$$A_R = \frac{P_R Q_R + P_I Q_I}{Q_R^2 + Q_I^2} \qquad B_R = \frac{S_R T_R + S_I T_I}{T_R^2 + T_I^2}$$

$$A_I = \frac{P_I Q_R - P_R Q_I}{Q_R^2 + Q_I^2} \qquad B_I = \frac{S_I T_R - S_R T_I}{T_R^2 + T_I^2}$$

$$k_{11} = A_R + B_R \qquad k_{12} = A_I - B_I$$
$$k_{21} = -A_I - B_I \qquad k_{22} = A_R - B_R$$

The other matrixes are obtained as described under 1.

FIGS. 6 and 7 illustrate two possible embodiments of the invention composed of two transmission members 1 with associated coefficient setting components, the coefficients for each member being set as described above. In FIG. 6 the two members 1 are connected together in parallel, while in FIG. 7 they are connected together in cascade.

2.3 Conjugated complex poles for the starting coefficients, real poles for the final coefficients In general terms, the sets of starting and final coefficients read as follows:

$$A_- = \begin{bmatrix} a_4^- & a_2^- \\ -a_2^- & a_4^- \end{bmatrix} B_- = \begin{bmatrix} b_4^- \\ b_2^- \end{bmatrix} C_- = [c_1^- \ c_2^-] \ D_- = d^-$$

$$A_- = \begin{bmatrix} a_4^+ & 0 \\ 0 & a_2^+ \end{bmatrix} B_+ = \begin{bmatrix} b_1^+ \\ b_2^+ \end{bmatrix} C_+ = [c_1^+ \ c_2^+] \ D_- = d^-$$

The elements of the matrix $K_{+-}$ can be obtained by the following steps:

$$P_R = b_1^+ b_1^- \qquad P_I = -b_1^+ b_2^-$$
$$Q_R = (1 - a_1^+ a_1^-) \qquad Q_I = -a_1^+ a_2^-$$
$$S_R = b_2^+ b_1^- \qquad S_I = -b_2^+ b_2^-$$
$$T_R = (1 - a_2^+ a_1^-) \qquad T_I = -a_2^+ a_2^-$$

$$A_R = \frac{P_R Q_R + P_I Q_I}{Q_R^2 + Q_I^2} \quad B_R = \frac{S_R T_R + S_I T_I}{T_R^2 + T_I^2}$$

$$A_I = \frac{P_I Q_R - P_R Q_I}{Q_R^2 + Q_I^2} \quad B_I = \frac{S_I T_R - S_R T_I}{T_R^2 + T_I^2}$$

$$k_{11} = A_R \qquad k_{12} = -A_I$$
$$k_{21} = B_R \qquad k_{22} = -B_I$$

The other matrices are obtained as described under 1.

2.4 Real poles for the starting coefficients conjugated complex poles for the final coefficients Here apply the results of 2.3 with + and − interchanged (Note that $K_{-+} = K_{+-}$)

2.5 Example

As a numerical example, consider the sets of starting and final coefficients given in table 1. The matrixes $A_-$ and $A_+$ both are normal, where $A_-$ has conjugated complex poles and $A_+$ has real poles. According to 2.1, 2.2 and 2.3, the matrixes $K_{+-}$, $K_{--}$, $W_{+-}$, and $W_{++}$ are given by $$K_{+-} = \begin{bmatrix} 1.851126 \cdot 10^{-2} & 1.816536 \cdot 10^{-2} \\ -2.941714 \cdot 10^{-2} & -2.997744 \cdot 10^{-2} \end{bmatrix}$$

$$K_{--} = \begin{bmatrix} 2.317236 \cdot 10^{-2} & 2.309880 \cdot 10^{-2} \\ 2.309880 \cdot 10^{-2} & 2.317248 \cdot 10^{-2} \end{bmatrix}$$

$$W_{+-} = \begin{bmatrix} 2.859773 \cdot 10^{2} & -2.806328 \cdot 10^{2} \\ 1.732960 \cdot 10^{2} & -1.765961 \cdot 10^{2} \end{bmatrix}$$

$$W_{++} = \begin{bmatrix} 6.554607 \cdot 10^{1} & 3.618892 \cdot 10^{1} \\ 3.618892 \cdot 10^{1} & 2.499455 \cdot 10^{1} \end{bmatrix}$$

The coefficient sets for the intermediate coefficients follow for

Solution 1 (claim 3):

$$A_o = \begin{bmatrix} 3.609666 & -2.980224 \\ 1.576830 & -2.592714 \end{bmatrix}$$

$$B_o = \begin{bmatrix} 1.736778 \cdot 10^{-2} \\ -5.856179 \cdot 10^{-2} \end{bmatrix}$$

$$C_o = C_-, D_o = D_-$$

Solution 2 (claim 4):

$$A_o = \begin{bmatrix} 2.544637 & -1.794882 \\ 2.939360 & -4.097593 \end{bmatrix}$$

$$B_o = \begin{bmatrix} 2.792571 \cdot 10^{-2} \\ -7.147593 \cdot 10^{-2} \end{bmatrix}$$

$$C_o = C_-, D_o = D_-$$

Solution 3 (claim 5):

$$A_o = \begin{bmatrix} 2.662604 & -1.893996 \\ 2.917472 & -4.101427 \end{bmatrix}$$

$$B_o = B_+$$

$$C_o = \begin{bmatrix} 1.154283 \cdot 10^{1} \\ -1.245341 \cdot 10^{1} \end{bmatrix}$$

$$D_o = D_+$$

Obviously, the intermediate coefficients are completely determined by the starting and the final coefficients of a given transmission member.

References [1], [2] (and references therein) outline in detail how the transmission members may be realized with the primitive operations addition, multiplication and delay, available in an abundance of hardware components or easily implemented in any computer language. An important subset of realizing structures are the state space structures, derived directly from the state space description of discrete time systems. For an example on the design of various state space structures for the realization of an transmission member with a given transfer function see e.g. [1] chapter 9,12.

The invention now being fully described, it will be apparent to one of ordinary skill in the art that many changes and modifications can be made thereto without departing from the spirit or scope of the invention as set forth herein.

The present disclosure relates to the subject matter disclosed in German Application P 3,702,215.6 of January 26th, 1987, the entire specification of which is incorporated herein by reference.

References

[1] R. A. Roberts, C. T. Mullis: Digital Signal Processing Addison-Wesley Publishing Company Reading, Massachusetts, 1987

[2] S. A. Tretter: Introduction to Discrete-Time Signal Processing John Wiley & Sons New York, 1976.

What is claimed is:

1. A digital transmission arrangement operating with coded scanning samples and having a transfer function which can be changed without interrupting operation and with low interference, starting from an initial transfer function and ending with a final transfer function, with each transfer function being defined by respective coefficients, said arrangement comprising: a transmission means having a transfer function which is determined by transmission coefficients supplied to said transmission means; and switching means connected to said transmission means and switchable for selectively supplying to said transmission means a first set of coefficients ($c_-$) constituting a set of starting coefficients and a second set of coefficients ($c_+$) constituting a set of final coefficients, wherein said switching means comprise: means for supplying to said transmission means, during a selected time, a single set of intermediate coefficients ($c_0$) between the set of starting coefficients ($c_-$) and the set of final coefficients ($c_+$); and coefficient value determining means coupled to said supplying means, for calculating and giving to said supplying means the set of intermediate coefficients ($c_0$) values, said determining means comprising means for calculating the set of intermediate coefficients ($c_0$) as a function of the set of starting coefficients ($c_-$) and the set of final coefficients ($c_+$) so that the interference to be expected during switching from the set of starting coefficients to the set of final coefficients is minimized.

2. Transmission arrangement as defined in claim 1 wherein said transmission means is a second degree digital filter in state space structure.

3. Transmission arrangement as defined in claim 2 wherein said coefficient value determining means give the set of intermediate coefficients ($c_0$) values such that, upon input to said transmission means of an arbitrary signal of a desired power density, a square of an expected value ($E(d_-^2(k))$) of a difference signal $d_-(k) = y(kT) - y_-(kT)$ between an output signal $y(kT)$ of said transmission means when operated with the set of intermediate coefficients ($c_0$) and an output signal $y_-(kT)$ of said transmission means when operated with the set of starting coefficients ($c_-$) becomes a minimum for $k = 0, 1, 2$, where k is the sample number, when said switching means apply the set of starting coefficients ($c_-$) for $k < 0$, the set of intermediate coefficients ($c_0$) for $k = 0$ and the set of final coefficients ($c_+$) for $k > 0$.

4. Transmission arrangement as defined in claim 2 wherein said coefficient value determining means give the set of intermediate coefficients ($c_0$) values such that, upon input to said transmission means of an arbitrary signal of a desired power density, the sum $$\sum_{k=0}^{\infty} E(d_-^2(k))$$

of the expected values $E(d_-^2(K))$ of squares of a difference signal $d_-(k) = y(kT) - y_-(kT)$ between an output signal $y(kT)$ of said transmission means when operated with the set of intermediate coefficients ($c_0$) and an output signal $y_-(kT)$ of said transmission means when operated with the set of starting coefficients ($c_-$) becomes a minimum for all $k \geq 0$, where k is the sample number, when said switching means apply the set of starting coefficients ($c_-$) for $k < 0$, the set of intermediate coefficients ($c_0$) for $k = 0$ and the set of final coefficients ($c_+$) for $k > 0$.

5. Transmission arrangement as defined in claim 2 wherein said coefficient value determining means give the set of intermediate coefficients ($c_0$) values such that, upon input to said transmission means of an arbitrary signal of a desired power density, the a $$\sum_{k=0}^{\infty} E(d_+^2(k))$$

of expected values $E(d_+^2(K))$ of squares of a difference signal $d_+(k) = y(kT) - y_+(kT)$ between an output signal $y(kT)$ of said transmission means when operated with the set of intermediate coefficients ($c_0$) and an output signal $y_+(kT)$ of said transmission means when operated with the set of final coefficients ($c_+$) becomes a minimum for all $k \geq 0$, where k is the sample number, when said switching means apply the set of starting coefficients ($c_-$) for $k < 0$, the set of intermediate coefficients ($c_0$) for $k = 0$ and the set of final coefficients ($c_+$) for $k > 0$.

6. Transmission arrangement as defined in claim 1 wherein there is a plurality of said transmission means connected together in either cascade or parallel for transmitting an input signal.

7. Transmission device as defined in claim 6 wherein there are two of said transmission means constituting first and second transmission means connected together for transmitting an input signal, and said coefficient value determining means of said first transmission means give the set of intermediate coefficients ($c_0$) values such that, upon input to said first transmission means of an arbitrary signal of a desired power density, an expected value $E(d_-^2(k))$ of a square of a difference signal $d_-(k) = y(kT) - y_-(kT)$ between an output signal $y(kT)$ of said first transmission means when operated with the set of intermediate coefficients ($c_0$) and an output signal $y_-(kT)$ of said first transmission means when operated with the set of starting coefficients ($c_-$) becomes a minimum for $k = 0, 1, 2$, where k is the sample number, when a switching means coupled to said first transmission means apply the set of starting coefficients ($c_-$) for $k < 0$, the set of intermediate coefficients ($c_0$) for $k = 0$ and the set of final coefficients ($c_+$) for $k > 0$.

8. Transmission arragement as defined in claim 7 wherein said coefficient value determining means of said second transmission means give the set of intermediate coefficients ($c_0$) values such that, upon input to said second transmission means of an arbitrary signal of a desired power density, a sum $$\sum_{k=0}^{\infty} E(d_-^2(k))$$

of the expected values $E(d_-^2(k))$ of squares of a difference signal $d_-(k) = y(kT) - y_-(kT)$ between the output signal $y(kT)$ of said second transmission means when operated with the set of intermediate coefficients ($c_0$) and an output signal $y_-(kT)$ of said second transmission means when operated with the set of starting coefficients ($c_-$) becomes a minimum for all $k \geq 0$ when a switching means coupled to said second transmission means apply the set of starting coefficients ($c_-$) for $k < 0$, the set of intermediate coefficients ($c_0$) for $k = 0$ and the set of final coefficients ($c_+$) for $k > 0$.

9. Transmission arrangement as defined in claim 8 wherein said first and second transmission means are connected together in cascade.

10. Transmission arrangement as defined in claim 8 wherein said first and second transmission means are connected together in parallel.

11. Transmission arrangement as defined in claim 7 wherein said coefficient value determining means of said second transmission means give the set of intermediate coefficients ($c_0$) values such that, upon input to said second transmission means of an arbitrary signal of a desired power density, a sum $$\sum_{k=0}^{\infty} E(d_+^2(k))$$

of expected values $E(d_+^2(K))$ of the squares of a difference signal $d_+(k) = y(kT) - y_+(kT)$ between an output signal $y(kT)$ of said second transmission means when operated with the set of intermediate coefficients ($c_0$) and an output signal $y_+(kT)$ of said second transmission means when operated with the set of final coefficients ($c_+$) becomes a minimum for all $k \geq 0$ when said switching means apply the set of starting coefficients ($c_-$) for $k < 0$, the set of intermediate coefficients ($c_0$) for $k = 0$ and the set of final coefficients ($c_+$) for $k > 0$.

12. Transmission arrangement as defined in claim 11 wherein said first and second transmission means are connected together in cascade.

13. Transmission arrangement as defined in claim 11 wherein said first and second transmission means are connected together in parallel.

14. Transmission arrangement as defined in claim 1 wherein said coefficient value determining means give the set of intermediate coefficients ($c_0$) values such that, upon input to said transmission means of an arbitrary signal of a desired power density, an expected value $E(d_-^2(K))$ of a square of a difference signal $d_-(k) = y(kT) - y_-(kT)$ between an output signal $y(kT)$ of said transmission means when operated with the set of intermediate coefficients ($c_0$) and an output signal $y_-(kT)$ of said transmission means when operated with the set of starting coefficients ($c_-$) becomes a minimum for $k = 0, 1, 2$ when said switching means apply the set of starting coefficients ($c_-$) for $k < 0$, the set of intermediate coefficients ($c_0$) for $k = 0$ and the set of final coefficients ($c_+$) for $k > 0$.

15. Transmission arrangement as defined in claim 1 wherein said coefficient value determining means give the set of intermediate coefficients ($c_0$) values such that, upon input to said transmission means of an arbitrary signal of a desired power density, a sum $$\sum_{k=0}^{\infty} E(d_-^2(k))$$

of expected values $E(d_-^2(K))$ of squares of a difference signal $d_-(k)=y(kT)-y_-(kT)$ between an output signal $y(kT)$ of said transmission means when operated with the set of intermediate coefficients ($c_0$) and an output signal $y_-(kT)$ of said transmission means when operated with the set of starting coefficients ($c_-$) becomes a minimum for all $k \geq 0$ when said switching means apply the set of starting coefficients ($c_-$) for $k<0$, the set of intermediate coefficients ($c_0$) for $k=0$ and the set of final coefficients ($c_+$) for $k>0$.

16. Transmission arrangement as defined in claim 1 wherein said coefficient value determining means give the set of intermediate coefficients ($c_0$) values such that, upon input to said transmission means of an arbitrary signal of a desired power density, a sum $$\sum_{k=0}^{\infty} E(d_+^2(k))$$

of expected values $E(d_-^2(K))$ of squares of a difference signal $d_+(k)=y(kT)-y_+(kT)$ between an output signal $y(kT)$ of said transmission means when operated with the set of intermediate coefficients ($c_0$) and an output signal $y_+(kT)$ of said transmission means when operated with the set of final coefficients ($c_+$) becomes a minimum for all $k \geq 0$ when said switching means apply the set of starting coefficients ($c_-$) for $k<0$, the set of intermediate coefficients ($c_0$) for $k=0$ and the set of final coefficients ($c_+$) for $k<0$.

* * * * *